(12) United States Patent
Choi et al.

(10) Patent No.: US 12,448,542 B2
(45) Date of Patent: Oct. 21, 2025

(54) SLURRY COMPOSITION FOR POLISHING ORGANIC FILM

(71) Applicant: KCTECH CO., LTD., Gyeonggi-do (KR)

(72) Inventors: Bo Hyeok Choi, Gyeonggi-do (KR); Jae Hak Lee, Gyeonggi-do (KR); Jae Woo Lee, Gyeonggi-do (KR); Ji Hye Kim, Gyeonggi-do (KR); Jae Ik Lee, Gyeonggi-do (KR)

(73) Assignee: KCTECH Co., Ltd., Anseong-si (KR)

( * ) Notice: Subject to any disclaimer, the term of this patent is extended or adjusted under 35 U.S.C. 154(b) by 315 days.

(21) Appl. No.: 17/786,741

(22) PCT Filed: Oct. 30, 2020

(86) PCT No.: PCT/KR2020/095132
§ 371 (c)(1),
(2) Date: Jun. 17, 2022

(87) PCT Pub. No.: WO2021/125919
PCT Pub. Date: Jun. 24, 2021

(65) Prior Publication Data
US 2023/0033789 A1 Feb. 2, 2023

(30) Foreign Application Priority Data
Dec. 20, 2019 (KR) .......................... 10-2019-0171515

(51) Int. Cl.
*C09G 1/02* (2006.01)
*C09K 3/14* (2006.01)
*H01L 21/306* (2006.01)

(52) U.S. Cl.
CPC .............. *C09G 1/02* (2013.01); *C09K 3/1436* (2013.01); *H01L 21/30625* (2013.01)

(58) Field of Classification Search
CPC ...... C09G 1/02; C09K 3/1436; C09K 3/1463; H01L 21/30625; H01L 21/31053

USPC .................................. 257/79.1; 438/690–693
See application file for complete search history.

(56) References Cited

U.S. PATENT DOCUMENTS

| 2010/0120250 | A1* | 5/2010 | Amanokura | ............... C23F 3/06 438/693 |
| 2019/0338163 | A1* | 11/2019 | Ho | ....................... H01L 21/3212 |
| 2020/0362198 | A1* | 11/2020 | Penta | ................. H01L 21/31055 |

FOREIGN PATENT DOCUMENTS

| JP | 2007144613 | A | 6/2007 | |
| JP | 2016517461 | A | 6/2016 | |
| KR | 20170040036 | A | 4/2017 | |
| KR | 20170076251 | A | 7/2017 | |
| KR | 20190053739 | A | 5/2019 | |
| TW | 200948941 | A | 12/2009 | |
| TW | 201612285 | A | 4/2016 | |
| TW | 201700663 | A | 1/2017 | |
| TW | 201718817 | A | 6/2017 | |
| WO | WO-2009119178 | A1 * | 10/2009 | ........... C01B 33/149 |
| WO | WO-2015140850 | A1 * | 9/2015 | ............. B24B 7/044 |
| WO | 2016186356 | A1 | 11/2016 | |
| WO | 2018101583 | A1 | 6/2018 | |

OTHER PUBLICATIONS

Polyacrylamide, Science Direct (Year: 2005).*
Translation of TW I410469 B (Year: 2013).*
International Search Report and Written Opinion for PCT/KR2020/095132, mailed Apr. 15, 2021 (10 pags).

* cited by examiner

*Primary Examiner* — Duy Vu N Deo
(74) *Attorney, Agent, or Firm* — KDW Firm PLLC

(57) ABSTRACT

The present invention relates to a slurry composition for polishing an organic film, and the slurry composition for polishing an organic film according to one embodiment of the present invention comprises: abrasive particles; a polishing control agent containing an organic acid, an inorganic acid, or both; an organic film polishing enhancer containing an amide compound or an amide polymer; an oxidizing agent; and a pH control agent.

16 Claims, No Drawings

SLURRY COMPOSITION FOR POLISHING ORGANIC FILM

CROSS-REFERENCE TO RELATED APPLICATIONS

This application is a national phase entry of, claims the benefit of and priority to previously filed International Patent Application No. PCT/KR2020/095132, entitled 'SLURRY COMPOSITION FOR POLISHING ORGANIC FILM", filed Oct. 30, 2020, which claims priority to Korean Patent Application No. 10-2019-0171515, filed Dec. 20, 2019, which are hereby incorporated by reference in their entireties.

TECHNICAL FIELD

The following description relates to a slurry composition for polishing an organic film.

BACKGROUND ART

As a semiconductor device is diversified and highly integrated, finer pattern forming techniques are being used, and accordingly, the surface structure of the semiconductor device is more complicated and the step difference between the surface films is also more increasing. In manufacturing a semiconductor device, a chemical mechanical polishing (CMP) process is used as a planarization technique for removing a step difference in a specific film formed on a substrate. For example, it may be classified into an oxide film CMP process, a metal CMP process, a poly-Si CMP process, an organic film CMP process, etc. depending on polishing target materials.

A typical example of a semiconductor process to which a CMP process for polishing an organic film is applied may include an interlayer dielectric (ILD) process. The ILD process, as a process for forming a fine pattern, is a process for removing an organic film (C-SOH) that has been formed in an excessive amount.

Conventionally, a reducing agent such as titanium trichloride has been added to a CMP slurry composition for an organic film and used. However, when using such a conventional CMP slurry composition for an organic film, it was not possible to obtain a selective polishing ratio for the organic film compared to an inorganic film required for the ILD process.

Further, the conventional CMP slurry composition for an organic film included a polymer abrasive since the organic film should be polished in a high polishing amount per unit time, and free from surface defects such as scratches. However, since the materials of the organic film and the polymer abrasive are different, when polishing with the conventional organic film CMP slurry composition depending on the organic film, the desired polishing amount could not be obtained at the same time while increasing also the flatness of the polishing surface. In addition, a desired polishing amount cannot be obtained depending on the organic film, or scratches occur so that there are problems in that defects occur on the polishing surface, and flatness is lowered.

Therefore, there is a need to develop a slurry composition for polishing an organic film, having excellent polishing performance for the organic film.

DISCLOSURE OF THE INVENTION

Technical Goals

The present invention is to solve the above problems, and an aspect of the present invention provides a slurry composition for polishing an organic film, which is capable of increasing the polishing rate of the organic film.

However, the problems to be solved by the present invention are not limited to those mentioned above, and other problems not mentioned will be clearly understood by those skilled in the art from the following description.

Technical Solutions

According to an aspect of the present invention, there is provided a slurry composition for polishing an organic film, the slurry composition including: abrasive particles; a polishing control agent containing an organic acid, an inorganic acid, or both thereof; an organic film polishing enhancer containing an amide-based compound or an amide-based polymer; an oxidizing agent; and a pH control agent.

In an embodiment, the abrasive particles may include at least one selected from the group consisting of a metal oxide, a metal oxide coated with an organic or inorganic material, and the metal oxide of a colloidal state, and the metal oxide may include at least one selected from the group consisting of silica, ceria, zirconia, alumina, titania, barium titania, germania, mangania, and magnesia.

In an embodiment, the abrasive particles may be substituted with an organic acid.

In an embodiment, the abrasive particles may include colloidal silica substituted with an organic acid.

In an embodiment, the size of the abrasive particles may include primary particles of 10 nm to 200 nm and secondary particles of 30 nm to 300 nm.

In an embodiment, the abrasive particles may be contained in an amount of 0.1% by weight to 10% by weight of the slurry composition for polishing an organic film.

In an embodiment, the organic acid may include at least one selected from the group consisting of oxalic acid, malic acid, maleic acid, malonic acid, formic acid, lactic acid, acetic acid, picolinic acid, citric acid, succinic acid, tartaric acid, glutaric acid, glutamic acid, glycolic acid, propionic acid, fumaric acid, salicylic acid, pimelic acid, benzoic acid, butyric acid, aspartic acid, sulfonic acid, and phthalic acid, and the inorganic acid may include at least one selected from the group consisting of nitric acid, sulfuric acid, hydrochloric acid, phosphoric acid, hydrofluoric acid, bromic acid, iodic acid, sulfamic acid, perchloric acid, chromic acid, sulfurous acid, nitrous acid, boronic acid, hydrofluoric acid, and fluoroboric acid.

In an embodiment, the polishing control agent may be contained in an amount of 0.1% by weight to 3% by weight of the slurry composition for polishing an organic film.

In an embodiment, the organic film polishing enhancer may include at least one selected from the group consisting of acetamide, N-methylacetamide, N-ethylacetamide, phthalamic acid, acrylamide, benzamide, naphthoamide, nicotinamide, isonicotinamide, phthalamide, isophthalamide, adipamide, terephthalamide, malonamide, succinamide, polyacrylamide, polyacrylamide copolymer, polyacrylamide terpolymer, and polyacrylamide tetrapolymer.

In an embodiment, the polyacrylamide copolymer may include an acrylic acid derivative, an acrylic acid derivative, or both thereof.

In an embodiment, the organic film polishing enhancer may have a molecular weight of 10 K to 1,000 K.

In an embodiment, the organic film polishing enhancer may be contained in an amount of 0.01% by weight to 0.5% by weight of the slurry composition for polishing an organic film.

In an embodiment, the oxidizing agent may include at least one selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxide sulfate, benzoyl peroxide, calcium peroxide, barium peroxide, sodium peroxide, and urea peroxide.

In an embodiment, the oxidizing agent may be contained in an amount of 0.1% by weight to 5% by weight of the slurry composition for polishing an organic film.

In an embodiment, the pH control agent may include at least one selected from the group consisting of benzylamine, monoethanolamine, diethanolamine, triethanolamine, trimethanolamine, dimethylbenzylamine, ethoxybenzylamine, monoisopropanolamine, aminoethylethanolamine, N,N-Diethylethanol amine, diethylenetriamine (DETA), triethylenetetramine (TETA), tetraethylenepentamine (TEPA), pentaethylenehexamine (PEHA), bis(hexamethylene)triamine, N-(3-aminopropyl)ethylenediamine (Am3), N,N'-bis(3-aminopropyl)ethylenediamine (Am4), N,N,N'-tris(3-aminopropyl)ethylenediamine (Am5), N-3-Aminopropyl-1,3-diaminopropane, N,-bis(3-aminopropyl)-1,3-diaminopropane, aminopropyl)-1,3-diaminopropane, bis-(3-aminopropyl)amine, dipropylenetriamine, and tripropylene tetramine.

In an embodiment, the pH control agent may be contained in an amount of 0.01% by weight to 1% by weight of the slurry composition for polishing an organic film.

In an embodiment, the slurry composition for polishing an organic film may have a pH range of 1 to 3.5.

In an embodiment, the slurry composition for polishing an organic film may have a zeta potential range of −50 mV to −10 mV.

In an embodiment, the organic film may include a carbon-based film containing a carbon-hydrogen bond.

In an embodiment, the organic film may include at least one selected from the group consisting of an amorphous carbon layer (ACL) film, an APF (trade name, manufactured by AMAT) film, a SiLK (trade name, manufactured by Dow Chemical) film, an NCP (trade name, manufactured by ASM) film, an AHM (trade name, manufactured by Novellous) film, and a carbon-spin on hardmask (C-SOH) film.

In an embodiment, the organic film may have a carbon content of 90% by atom or more.

In an embodiment, the organic film may have a polishing amount of 30 Å/min to 200 Å/min.

Advantageous Effects

The slurry composition for polishing an organic film according to an example of the present invention has a high polishing function by increasing the polishing rate for an organic film having a high carbon content. Further, when it corresponds to a specific range of pH, the organic film can be effectively removed, and surface defects caused by abrasive particles or residues can be minimized.

BEST MODE FOR CARRYING OUT THE INVENTION

Hereinafter, examples of the present invention will be described in detail with reference to the accompanying drawings. In describing the present invention, if it is determined that a detailed description of a related known function or configuration may unnecessarily obscure the gist of the present invention, the detailed description thereof will be omitted. In addition, the terms used in the present specification are terms used to properly express a preferred example of the present invention, which may vary depending on the intention of a user or operator or a custom in the field to which the present invention belongs. Accordingly, definitions of these terms should be made based on the content throughout the present specification. The same reference numerals presented in each figure indicate the same members.

Throughout the specification, when a member is said to be located "on" other member, this includes not only a case in which a member is in contact with other member but also a case in which another member exists between the two members.

Throughout the specification, when a part "includes" a certain component, it means that other components may be further included, rather than excluding other components.

Hereinafter, the slurry composition for polishing an organic film according to the present invention will be described in detail with reference to examples and drawings. However, the present invention is not limited to these examples and drawings.

The slurry composition for polishing an organic film according to an example of the present invention includes: abrasive particles; a polishing control agent containing an organic acid, an inorganic acid, or both thereof; an organic film polishing enhancer containing an amide-based compound or an amide-based polymer; an oxidizing agent; and a pH control agent.

The slurry composition for polishing an organic film according to an example of the present invention has a high polishing function by increasing the polishing rate for an organic film having a high carbon content. Further, when it corresponds to a specific range of pH, the organic film may be effectively removed, and surface defects caused by abrasive particles or residues may be minimized.

In an embodiment, the abrasive particles may include at least one selected from the group consisting of a metal oxide, a metal oxide coated with an organic or inorganic material, and the metal oxide of a colloidal state, and the metal oxide may include at least one selected from the group consisting of silica, ceria, zirconia, alumina, titania, barium titania, germania, mangania, and magnesia.

According to an embodiment, the abrasive particles may be substituted with an organic acid. The organic acid may include at least one selected from the group consisting of oxalic acid, malic acid, maleic acid, malonic acid, formic acid, lactic acid, acetic acid, picolinic acid, citric acid, succinic acid, tartaric acid, glutaric acid, glutamic acid, glycolic acid, propionic acid, fumaric acid, salicylic acid, pimelic acid, benzoic acid, butyric acid, aspartic acid, sulfonic acid, and phthalic acid.

The abrasive particles may have a negative charge indicating a negative charge at pH 3.4 or less through the substitution with the organic acid. The pH at which the zeta potential becomes 0 is called the isoelectric point (IEP), and the amourphous carbon layer (ACL) in the organic film has a zeta potential level of 3.4. The zeta potential of the ACL film has a positive charge indicating a positive charge at pH 3.4 or less. Therefore, an adsorption force between the abrasive particles substituted with the organic acid and the organic film is strong so that the organic film polishing rate may be increased.

According to an embodiment, the abrasive particles may be prepared by a liquid phase method and dispersed so as to have a negative charge on the surface of the abrasive particles. The abrasive particles may include those prepared by a liquid phase method, but is not limited thereto. In the liquid phase method, the abrasive particles may be prepared by applying a sol-gel method in which an abrasive particle precursor is chemically reacted in an aqueous solution and crystals are grown to obtain fine particles, a co-precipitation method in which abrasive particle ions are precipitated in an aqueous solution, a hydrothermal synthesis method in which abrasive particles are formed under high temperature and high pressure, or other methods. The abrasive particles prepared by the liquid phase method are dispersed so that the surface of the abrasive particles has a negative charge.

In an embodiment, the abrasive particles may include colloidal silica substituted with an organic acid.

In an embodiment, the size of the abrasive particles may include primary particles of 10 nm to 200 nm and secondary particles of 30 nm to 300 nm. The measurement of the average particle diameter of the abrasive particles is an average particle diameter value of a plurality of particles within a viewing range that may be measured by scanning electron microscope analysis or dynamic light scattering. The size of the primary particles should be 200 nm or less to ensure particle uniformity, and when it is less than 5 nm, the polishing rate may be reduced. In the size of the secondary particles in the slurry composition for polishing an organic film, when it is less than 30 nm, if small particles are excessively produced due to milling, the cleanability is deteriorated, and excessive defects occur on the wafer surface. When it exceeds 300 nm, excessive polishing is made, making it difficult to control the selectivity, and there are a possibility that dishing, erosion, and surface defects may occur.

According to an embodiment, the abrasive particles may include mixed particles including a multi-dispersion type particle distribution in addition to single-size particles. For example, the abrasive particles may include those in which two types of abrasive particles having different average particle sizes are mixed to have a bimodal type particle distribution or those in which three types of abrasive particles having different average particle sizes are mixed to have a particle size distribution showing three peaks. Alternatively, four or more types of abrasive particles having different average particle sizes may be mixed to have a multi-dispersion type particle distribution. Since relatively large abrasive particles and relatively small abrasive particles are mixed in the abrasive particles, the abrasive particles have more excellent dispersibility and expect an effect of reducing scratches on the wafer surface.

According to an embodiment, the shape of the abrasive particles may include at least one selected from the group consisting of a spherical shape, a square shape, a needle shape, and a plate shape, and preferably a spherical shape.

According to an embodiment, the abrasive particles may be monocrystalline. When monocrystalline abrasive particles are used, a scratch reduction effect may be achieved compared to polycrystalline abrasive particles, dishing may be improved, and cleanability after polishing may be improved.

In an embodiment, the abrasive particles may be contained in an amount of 0.1% by weight to 10% by weight of the slurry composition for polishing an organic film. When the abrasive particles are contained in an amount of less than 1% by weight of the slurry composition for polishing an organic film, there is a problem in that the polishing rate is reduced, and when they are contained in an amount of exceeding 10% by weight, the polishing rate is too high, and surface defects may be caused by adsorption properties of particles remained on the surface due to an increase in the number of abrasive particles.

In an embodiment, the polishing control agent may be one that performs a chemical polishing action by breaking bonds between the polymer compounds constituting the organic film.

In an embodiment, the organic acid may include at least one selected from the group consisting of oxalic acid, malic acid, maleic acid, malonic acid, formic acid, lactic acid, acetic acid, picolinic acid, citric acid, succinic acid, tartaric acid, glutaric acid, glutamic acid, glycolic acid, propionic acid, fumaric acid, salicylic acid, pimelic acid, benzoic acid, butyric acid, aspartic acid, and phthalic acid, and the inorganic acid may include at least one selected from the group consisting of nitric acid, sulfuric acid, hydrochloric acid, phosphoric acid, hydrofluoric acid, bromic acid, iodic acid, sulfamic acid, perchloric acid, chromic acid, sulfurous acid, nitrous acid, boronic acid, hydrofluoric acid, and fluoroboric acid.

In an embodiment, the polishing control agent may be contained in an amount of 0.1% by weight to 3% by weight of the slurry composition for polishing an organic film. When the polishing control agent is contained in an amount of less than 0.1% by weight of the slurry composition for polishing an organic film, the polishing rate is lowered, and when it is contained in an amount of exceeding 3% by weight, there is a risk of over-polishing the organic film.

In an embodiment, the organic film polishing enhancer may include an amide-based compound or an amide-based polymer. When the amide-based compound is used, the polishing rate of the organic film may be slightly increased, and when the amide-based polymer is used, the polishing rate of the organic film may be increased. Particularly, as the molecular weight increases (up to 400 K), the polishing rate of the organic film increases, and then becomes saturated.

In an embodiment, the organic film polishing enhancer may include at least one selected from the group consisting of acetamide, N-methylacetamide, N-ethylacetamide, phthalamic acid, acrylamide, benzamide, naphthoamide, nicotinamide, isonicotinamide, phthalamide, isophthalamide, adipamide, terephthalamide, malonamide, succinamide, polyacrylamide, polyacrylamide copolymer, polyacrylamide terpolymer, and polyacrylamide tetrapolymer.

In an embodiment, the polyacrylamide copolymer may include an acrylic acid derivative, an acrylic acid derivative, or both thereof.

In an embodiment, the polyacrylamide copolymer may include, for example, CELB-217-063-2 or DP/EM 5015.

In an embodiment, the organic film polishing enhancer may have a molecular weight of 10 K to 1,000 K. When the organic film polishing enhancer has a molecular weight of less than 10 K, the polishing performance of the organic film is deteriorated, and even when it has a molecular weight of exceeding 1,000 K, the polishing performance is not improved.

In an embodiment, the organic film polishing enhancer may be contained in an amount of 0.01% by weight to 0.5% by weight of the slurry composition for polishing an organic film.

In an embodiment, the oxidizing agent oxidizes the organic film to contribute to an increase in the polishing rate.

In an embodiment, the oxidizing agent may include at least one selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxide sulfate, benzoyl peroxide, calcium peroxide, barium peroxide, sodium peroxide, and urea peroxide.

In an embodiment, the oxidizing agent may be contained in an amount of 0.1% by weight to 5% by weight of the slurry composition for polishing an organic film. When the oxidizing agent is contained in an amount of less than 0.1% by weight of the slurry composition for polishing an organic film, the polishing rate and oxidation rate of the organic film may be reduced, and when it is contained in an amount of exceeding 5% by weight, the organic film becomes hard so that polishing may not be performed.

In an embodiment, since the pH control agent is advantageous in dispersion stability, it is possible to secure high-speed polishing performance and good polishing surface for the organic film that is a polishing target of the present invention.

In an embodiment, the pH control agent may include at least one selected from the group consisting of benzylamine, monoethanolamine, diethanolamine, triethanolamine, trimethanolamine, dimethylbenzylamine, ethoxybenzylamine, monoisopropanolamine, aminoethylethanolamine, N,N-Diethylethanol amine, diethylenetriamine (DETA), triethylenetetramine (TETA), tetraethylenepentamine (TEPA), pentaethylenehexamine (PEHA), bis(hexamethylene)triamine, N-(3-aminopropyl)ethylenediamine (Am3), N,N'-bis(3-aminopropyl)ethylenediamine (Am4), N,N,N'-tris(3-aminopropyl)ethylenediamine (Am5), N-3-Aminopropyl-1,3-diaminopropane, N,N'-bis(3-aminopropyl)-1,3-diaminopropane, aminopropyl)-1,3-diaminopropane, bis-(3-aminopropyl)amine, dipropylenetriamine, and tripropylene tetramine.

In an embodiment, the pH control agent may be contained in an amount of 0.01% by weight to 1% by weight of the slurry composition for polishing an organic film. When the pH control agent is contained in an amount of less than 0.01% by weight of the slurry composition for polishing an organic film, the polishing rate is reduced, and when it is contained in an amount of exceeding 1% by weight thereof, there is a risk of over-polishing the organic film.

In an embodiment, the slurry composition for polishing an organic film may have a pH range of 1 to 3.5. Preferably, the pH of the slurry composition for polishing an organic film may be in a range of 1.5 to 2.5 or 2. The pH control agent may be added in an amount of adjusting the pH of the slurry composition for polishing an organic film. When the pH of the slurry composition for polishing an organic film is out of the above range, the polishing rate may be reduced, and defects such as dishing and surface imbalance may occur.

In an embodiment, the slurry composition for polishing an organic film may have a zeta potential range of −50 mV to −10 mV. The zeta potential of the slurry composition for polishing an organic film may be, preferably, a negative slurry composition exhibiting a negative charge. The slurry composition for polishing an organic film may be in a zeta potential range of −50 mV to −10 mV. Due to the negatively charged abrasive particles, the zeta potential of the slurry composition for polishing an organic film may be a negative slurry composition exhibiting a negative charge, and when the zeta potential value exceeds −10 mV, dispersion due to electrostatic repulsive force is weak so that there is a risk of aggregation.

In an embodiment, the organic film may include a carbon-based film containing a carbon-hydrogen (C—H) bond.

In an embodiment, the organic film may include at least one selected from the group consisting of an amorphous carbon layer (ACL) film, an APF (trade name, manufactured by AMAT) film, a SiLK (trade name, manufactured by Dow Chemical) film, an NCP (trade name, manufactured by ASM) film, an AHM (trade name, manufactured by Novellous) film, and a carbon-spin on hardmask (C-SOH) film.

In an embodiment, the C-SOH film generally refers to a carbon-based °hardmask film, but in the present invention, it means as a whole a carbon-based film having a resist function of a resist film formed in the self-aligned double patterning technology (SaDPT) or a gap-filling or etching prevention film that fills the via-holes of an inorganic film such as a silica film deposited on the patterned wafer.

In an embodiment, the organic film may have a carbon content of 90% by atom or more. The organic film may have a carbon content of, for example, about 90% by atom to about 99% by atom or about 95% by atom to about 99% by atom. When the organic film in the above range is polished with the slurry composition for polishing an organic film, the polishing amount is high, scratches do not also occur, and the flatness of the polishing surface may also be high.

The organic film that is a polishing target according to the present invention may be manufactured by applying an organic film composition and then thermosetting it at a high temperature, for example, about 300° C. to 700° C. When polishing the organic film with the composition for polishing in the above range, the polishing amount is high, scratches do not also occur, and the flatness of the polishing surface may also be high.

In an embodiment, the organic film may have a polishing amount of 30 Å/min to 200 Å/min. The slurry composition for polishing an organic film according to the present disclosure may have an ACL removal rate of at least about 30 Å/min (e.g., at least about 8,500 Å/min, at least about 9,000 Å/min, at least about 9,500 Å/min, at least about 10,000 Å/min, at least about 10,500 Å/min, at least about 11,000 Å/min, at least about 11,500 Å/min, or at least about 12,000 Å/min) to up to about 15,000 Å/min (e.g., up to about 14,000 Å/min or up to about 13,000 Å/min). As noted in the present invention, the ACL removal rate is measured at a polishing downforce pressure of 2.0 psi.

Hereinafter, the present invention will be described in more detail by Examples and Comparative Examples.

However, the following Examples are only for illustrating the present invention, and the content of the present invention is not limited to the following Examples.

EXAMPLE 1

After dispersing 1% by weight of colloidal silica substituted with organic acid in 65% by weight in ultrapure water, 0.3 weight of oxalic acid as a polishing control agent and 0.1% by weight of polyacrylamide (PAAM) having a molecular weight of 400 K as an organic film polishing enhancer were injected, 0.5% by weight of hydrogen peroxide as an oxidizing agent was injected, benzylamine as a pH control agent was added to adjust the pH to 2.0, and the mixing was performed for 30 minutes to prepare a slurry composition for polishing an organic film.

EXAMPLE 2

A slurry composition for polishing an organic film was prepared in the same manner as in Example 1 except that 0.25% by weight of nicotinamide (N-amide) having a molecular weight of 120 was added as an organic film polishing enhancer in Example 1.

EXAMPLE 3

A slurry composition for polishing an organic film was prepared in the same manner as in Example 1 except that 0.05% by weight of polyacrylamide having a molecular weight of 100 K was added as an organic film polishing enhancer in Example 1.

EXAMPLE 4

A slurry composition for polishing an organic film was prepared in the same manner as in Example 1 except that 0.05% by weight of polyacrylamide was added as an organic film polishing enhancer in Example 1.

EXAMPLE 5

A slurry composition for polishing an organic film was prepared in the same manner as in Example 1 except that 0.05% by weight of polyacrylamide having a molecular weight of 5,000 K was added as an organic film polishing enhancer in Example 1.

EXAMPLE 6

A slurry composition for polishing an organic film was prepared in the same manner as in Example 1 except that 3.0% by weight of hydrogen peroxide was added as an oxidizing agent in Example 1.

EXAMPLE 7

A slurry composition for polishing an organic film was prepared in the same manner as in Example 1 except that 5% by weight of organic acid-substituted colloidal silica was added as abrasive particles in Example 1.

EXAMPLE 8

A slurry composition for polishing an organic film was prepared in the same manner as in Example 1 except that 0.3% by weight of citric acid was added as a polishing control agent in Example 1.

Comparative Example 1

A slurry composition was prepared in the same manner as in Example 1 except that the organic film polishing enhancer was not added in Example 1.

Comparative Example 2

A slurry composition was prepared in the same manner as in Comparative Example 1 except that conventional colloidal silica abrasive particles were added as abrasive particles in Comparative Example 1.

Comparative Example 3

A slurry composition was prepared in the same manner as in Example 1 except that 0.05% by weight of hydroxyethyl cellulose (HEC) having a molecular weight of 90 K was added instead of the polyacrylamide organic film polishing enhancer in Example 1.

Comparative Example 4

A slurry composition was prepared in the same manner as in Example 1 except that 0.05% by weight of polyethylene glycol (PEG) having a molecular weight of 20 K was added instead of the polyacrylamide organic film polishing enhancer in Example 1.

Polishing was carried out under the polishing conditions as described above using the slurry compositions for polishing an organic film of Examples 1 to 8 and the slurry compositions for polishing of Comparative Examples 1 to 4.

Polishing Conditions
1. Polishing machine: AP-300 (CTS company)
2. Carrier RPM: 87 rpm
3. Platen RPM: 93 rpm
4. Wafer pressure: 2.0 psi
5. R-ring pressure: 6.5 psi
6. Slurry flow rate: 250 ml/min
7. Polishing pad: IC 1000 (DOW company)

Table 1 below shows ACL polishing amounts using the slurry compositions for polishing an organic film of Examples 1 to 8 and the slurry compositions for polishing of Comparative Examples 1 to 4.

TABLE 1

| | Particles | | Polishing control agent | | Organic film polishing enhancer | | | pH control agent | Oxidizing agent | | | ACL polishing amount |
|---|---|---|---|---|---|---|---|---|---|---|---|---|
| | Type | % by weight | Type | % by weight | Type | Mw | % by weight | | Type | % by weight | pH | (Å/min) |
| Example 1 | A | 1.0 | Oxalic acid | 0.3 | PAAM | 400,000 | 0.1 | BA | $H_2O_2$ | 0.5 | 2.0 | 140 |
| Example 2 | A | 1.0 | Oxalic acid | 0.3 | N-amide | 120 | 0.25 | BA | $H_2O_2$ | 0.5 | 2.0 | 31 |
| Example 3 | A | 1.0 | Oxalic acid | 0.3 | PAAM | 100,000 | 0.05 | BA | $H_2O_2$ | 0.5 | 2.0 | 35 |
| Example 4 | A | 1.0 | Oxalic acid | 0.3 | PAAM | 400,000 | 0.05 | BA | $H_2O_2$ | 0.5 | 2.0 | 122 |
| Example 5 | A | 1.0 | Oxalic acid | 0.3 | PAAM | 5,000,000 | 0.5 | BA | $H_2O_2$ | 0.5 | 2.0 | 105 |
| Example 6 | A | 1.0 | Oxalic acid | 0.3 | PAAM | 400,000 | 0.1 | BA | $H_2O_2$ | 3.0 | 2.0 | 146 |
| Example 7 | A | 5.0 | Oxalic acid | 0.3 | PAAM | 400,000 | 0.1 | BA | $H_2O_2$ | 0.5 | 2.0 | 152 |
| Example 8 | A | 1.0 | Oxalic acid | 0.3 | PAAM | 400,000 | 0.1 | BA | $H_2O_2$ | 0.5 | 2.0 | 124 |

TABLE 1-continued

| | Particles | | Polishing control agent | | Organic film polishing enhancer | | | pH control agent | Oxidizing agent | | | ACL polishing amount (Å/min) |
|---|---|---|---|---|---|---|---|---|---|---|---|---|
| | Type | % by weight | Type | % by weight | Type | Mw | % by weight | | Type | % by weight | pH | |
| Comparative Example 1 | A | 1.0 | Oxalic acid | 0.3 | — | — | — | BA | $H_2O_2$ | 0.5 | 2.0 | 12 |
| Comparative Example 2 | B | 1.0 | Oxalic acid | 0.3 | — | — | — | BA | $H_2O_2$ | 0.5 | 2.0 | 5 |
| Comparative Example 3 | A | 1.0 | Oxalic acid | 0.3 | HEC | 90,000 | 0.05 | BA | $H_2O_2$ | 0.5 | 2.0 | 13 |
| Comparative Example 4 | A | 1.0 | Oxalic acid | 0.3 | PEG | 20,000 | 0.05 | BA | $H_2O_2$ | 0.5 | 2.0 | 3 |

A: Organic acid-substituted colloidal silica
B: Conventional Colloidal silica

Referring to Table 1, it may be confirmed that when the slurry compositions for polishing an organic film of Examples 1 to 8 were used, the polishing rates in ACL were excellent compared to when the slurry compositions of Comparative Examples 1 to 4 were used.

The low polishing rates of the slurry compositions for polishing an organic film of Examples 2 and 3 seem to be due to the addition of an amide-based compound and an amide-based polymer which have a low molecular weight.

Although the examples have been described with reference to the limited Examples and drawings as described above, various modifications and variations are possible from the above description by one of ordinary skill in the art. For example, appropriate results may be achieved although described techniques are performed in order different from a described method, and/or described elements are joined or combined in a form different from the described method, or replaced or substituted by other elements or equivalents. Therefore, other embodiments, other Examples, and equivalents to the scope of claims also belong to the scope of the claims to be described later.

The invention claimed is:

1. A slurry composition for polishing an organic film, the slurry composition comprising:
    abrasive particles;
    a polishing control agent containing an organic acid, an inorganic acid, or both thereof;
    an organic film polishing enhancer containing an amide-based compound or an amide-based polymer;
    an oxidizing agent; and
    a pH control agent,
    wherein the organic film polishing enhancer includes polyacrylamide,
    wherein the organic film polishing enhancer has a molecular weight of 400 K to 1,000 K,
    wherein the organic film includes a carbon-based film containing a carbon-hydrogen bond.

2. The slurry composition of claim 1, wherein the abrasive particles include at least one selected from the group consisting of a metal oxide, a metal oxide coated with an organic or inorganic material, and the metal oxide of a colloidal state, and the metal oxide includes at least one selected from the group consisting of silica, ceria, zirconia, alumina, titania, barium titania, germania, mangania, and magnesia.

3. The slurry composition of claim 1, wherein the abrasive particles are substituted with an organic acid.

4. The slurry composition of claim 1, wherein the abrasive particles include colloidal silica substituted with an organic acid.

5. The slurry composition of claim 1, wherein the size of the abrasive particles includes primary particles of 10 nm to 200 nm and secondary particles of 30 nm to 300 nm.

6. The slurry composition of claim 1, wherein the abrasive particles are contained in an amount of 0.1% by weight to 10% by weight of the slurry composition for polishing an organic film.

7. The slurry composition of claim 1, wherein the organic acid includes at least one selected from the group consisting of oxalic acid, malic acid, maleic acid, malonic acid, formic acid, lactic acid, acetic acid, picolinic acid, citric acid, succinic acid, tartaric acid, glutaric acid, glutamic acid, glycolic acid, propionic acid, fumaric acid, salicylic acid, pimelic acid, benzoic acid, butyric acid, aspartic acid, sulfonic acid, and phthalic acid, and the inorganic acid includes at least one selected from the group consisting of nitric acid, sulfuric acid, hydrochloric acid, phosphoric acid, hydrofluoric acid, bromic acid, iodic acid, sulfamic acid, perchloric acid, chromic acid, sulfurous acid, nitrous acid, boronic acid, hydrofluoric acid, and fluoroboric acid.

8. The slurry composition of claim 1, wherein the polishing control agent is contained in an amount of 0.1% by weight to 3% by weight of the slurry composition for polishing an organic film.

9. The slurry composition of claim 1, wherein the organic film polishing enhancer is contained in an amount of 0.01% by weight to 0.5% by weight of the slurry composition for polishing an organic film.

10. The slurry composition of claim 1, wherein the oxidizing agent includes at least one selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxide sulfate, benzoyl peroxide, calcium peroxide, barium peroxide, sodium peroxide, and urea peroxide, and is contained in an amount of 0.1% by weight to 5% by weight of the slurry composition for polishing an organic film.

11. The slurry composition of claim 1, wherein the pH control agent includes at least one selected from the group consisting of benzylamine, monoethanolamine, diethanolamine, triethanolamine, trimethanolamine, dimethylbenzylamine, ethoxybenzylamine, monoisopropanolamine, aminoethylethanolamine, N,N-Diethylethanolamine, diethylenetriamine (DETA), triethylenetetramine (TETA), tetraethylenepentamine (TEPA), pentaethylenehexamine (PEHA), bis(hexamethylene)triamine, N-(3-aminopropyl) ethylenediamine (Am3), N,N'-bis(3-aminopropyl)ethylenediamine (Am4), N,N,N'-tris(3-aminopropyl)ethylenediamine (Am5), N-3-Aminopropyl-1,3-diaminopropane, N,N'-bis(3-aminopropyl)-1,3-diaminopropane, N,N,N'-tris(3-aminopropyl)-1,3-diaminopropane, bis-(3-aminopropyl)amine, dipropylenetriamine, and tripropylene tetramine, and is contained in an amount of 0.01% by weight to 1% by weight of the slurry composition for polishing an organic film.

12. The slurry composition of claim 1, wherein the slurry composition for polishing an organic film has a pH range of 1 to 3.5.

13. The slurry composition of claim 1, wherein the slurry composition for polishing an organic film has a zeta potential range of 50 mV to 10 mV.

14. The slurry composition of claim 1, wherein the organic film includes at least one selected from the group consisting of an amorphous carbon layer (ACL) film, an APF (trade name, manufactured by AMAT) film, and a carbon-spin on hardmask (C-SOH) film.

15. The CMP slurry composition of claim 1, wherein the organic film has a carbon content of 90% by atom or more.

16. The slurry composition of claim 1, wherein the organic film has a polishing amount of 30 Å/min to 200 Å/min.

* * * * *